United States Patent [19]
Yashiro et al.

[11] Patent Number: 5,364,812
[45] Date of Patent: Nov. 15, 1994

[54] HIGH DENSITY DYNAMIC RAM CELL

[75] Inventors: Masaaki Yashiro, Plano, Tex.; Shigeki Morinaga, Avezzanoa, Italy; Clarence W. Teng, Plano, Tex.

[73] Assignee: Texas Instruments Inc., Dallas, Tex.

[21] Appl. No.: 86,524

[22] Filed: Jul. 1, 1993

Related U.S. Application Data

[60] Continuation of Ser. No. 765,419, Sep. 25, 1991, abandoned, which is a continuation of Ser. No. 550,610, Jul. 10, 1990, abandoned, which is a division of Ser. No. 366,801, Jun. 14, 1989, Pat. No. 5,057,887.

[51] Int. Cl.$^5$ .............................................. H01L 21/70
[52] U.S. Cl. .............................................. 437/52; 437/47; 437/60
[58] Field of Search ................. 437/47, 48, 52, 60, 437/228, 233, 235, 238, 919; 257/301

[56] References Cited

U.S. PATENT DOCUMENTS

| | | | |
|---|---|---|---|
| 4,364,074 | 12/1982 | Garnache et al. | 437/203 |
| 4,686,000 | 8/1987 | Heath | 437/241 |
| 4,731,342 | 3/1988 | Ishiuchi | 437/52 |
| 4,734,384 | 3/1988 | Tsuchiya | 437/52 |
| 4,798,794 | 1/1989 | Ogura et al. | 357/23.6 |
| 4,921,816 | 5/1990 | Ino | 357/23.6 |
| 4,964,561 | 9/1987 | Lebowitz | 437/52 |
| 5,100,823 | 3/1992 | Yamada | 437/203 |

FOREIGN PATENT DOCUMENTS

| | | | |
|---|---|---|---|
| 0241948 | 10/1987 | European Pat. Off. | 357/23.6 |
| 0056445 | 3/1986 | Japan | 357/23.6 |
| 0289657 | 10/1986 | Japan | 357/23.6 |
| 0155662 | 1/1988 | Japan | 357/23.6 |
| 0104371 | 5/1988 | Japan | 357/23.6 |
| 0018253 | 1/1989 | Japan | 357/23.6 |

OTHER PUBLICATIONS

Ghandhi "VLSI Fabrication Principles", John Wiley and Sons, 1983 pp. 299–303.
Refractory Silicides for Integrated Circuits, S. P. Murarka J. Vac. Science Tech. Jul./Aug. 80 pp. 775–792.

*Primary Examiner*—Tom Thomas
*Attorney, Agent, or Firm*—Richard B. Havill; Richard L. Donaldson; Douglas A. Sorensen

[57] ABSTRACT

The described embodiments of the present invention provide a memory cell and method for fabricating that memory cell and memory array including the cell. The memory cell is a trench capacitor type having a transistor (1-1-2) formed on the surface of a major face of a substrate (16) and having a capacitor (2-1-2) formed in the substrate around the periphery of a trench. The capacitor and transistor are connected by a buried, heavily doped region (26) having the opposite conductivity type from the substrate. A doped storage area (24) having the same doping type as the buried doped region surrounds the trench. A field plate (30) is formed in the trench separated from the storage region by a dielectric layer (32). The field plate extends onto the isolation areas between memory cells thus providing isolation between cells using a minimum of surface area. A self-aligned process is used to form the source (14) and drain (12) for the pass gate transistor and automatic connection between the source of the transistor and the buried doping layer is made by the buried N+ layer. A sidewall silicon nitride passivation filament (38) is formed to protect the sidewalls of the interlevel insulator region between the first (30) and second (3-3, 3-4) polycrystalline silicon layers.

10 Claims, 11 Drawing Sheets

HIGH DENSITY DYNAMIC RAM CELL

This application is a continuation of application Ser. No. 07/765,419, filed Sep. 25, 1991, now abandoned, which is a continuation of application Ser. No. 07/550,610, filed Jul. 10, 1990, now abandoned, which is a divisional of application Ser. No. 07/366,801, filed Jun. 14, 1989, U.S. Pat. No. 5,057,887.

FIELD OF THE INVENTION

The present invention is related to the field of digital integrated circuitry. More specifically, the present invention is related to the field of dynamic random access memories.

BACKGROUND OF THE INVENTION

Few electronic components have received as much engineering attention as dynamic random access memory (DRAM) cells. The most commonly used memory cell is the one transistor-one capacitor type. The transistor, called a transfer transistor, controls current to and from a bit line attached to the drain of the transistor. Usually, a five volt charge is placed across the capacitor to represent a one and a zero volt charge is placed across the capacitor to represent a zero. Data is read from the memory cell by turning on the transfer transistor and determining the charge stored on the capacitor. The sophisticated applications available in many digital devices, such as microcomputers, creates a high demand on memory capacity. This creates intense pressure to pack as much memory capacity onto a single chip as possible. Enormous amounts of engineering talent and time have been applied to the task of reducing the size of memory cells so as to provide a greater number of cells on a single chip. One such type of memory cell is the trench capacitor cell.

In the trench capacitor cell, a transistor is formed in the surface of the major face of a semiconductor substrate. This transistor controls current to a capacitor which is formed in some manner in or surrounding a trench etched into the major face of the substrate. By forming the capacitor around the trench, a much greater capacitance value may be attained in a given surface area of the major face of the substrate. Examples of such memory cells in the prior art are Baglee, et al., U.S. Pat. No. 4,721,987, issued Jan. 26, 1988 and assigned to the assignee of this application, Kuo, No. 4,225,945, issued Sep. 30, 1980 and assigned to the assignee of the application and Japan Kokai No. 51-130178, published Dec. 11, 1976.

The trench capacitor memory cells do substantially decrease the surface area of memory cells. However, these types of memory cells introduce complexities which cause poor yield and increased expense of manufacture. In addition, although the memory cells themselves have been shrunk using the prior art trench transistor concepts, the isolation area between memory cells still occupies a substantial mount of substrate surface area.

SUMMARY OF THE INVENTION

The described embodiments of the present invention provide a memory cell and method for fabricating that memory cell. The memory cell is a trench capacitor type having a pass transistor formed on the surface of a major face of a substrate and having a capacitor formed in the substrate around the periphery of a trench. The capacitor and the pass transistor are connected by a buried, heavily doped region having the opposite conductivity type from the substrate. A doped storage area having the same doping type as the buffed doping region surrounds the trench. A field plate is formed in the trench separated from the storage region by a dielectric. The field plate extends onto the isolation areas between memory cells thus providing isolation between cells using a minimum of surface area. A silicon dioxide ring is formed to protect the buried N+ layer when the trench is etched through the buried N+ layer. A serf-aligned process is used to form the source and drain for the pass transistor and automatic connection between the source of the pass transistor and the buried doping layer is made by the buried N+ layer. A sidewall silicon nitride passivation filament is formed to protect the sidewalls of the interlevel insulator region between the first and second polycrystalline silicon layers.

The method for forming this cell provides a relatively simple method using as many self-aligned processes as possible to provide a small cell and an uncomplicated process to minimize yield losses due to process fluctuations. One embodiment of the method for fabricating the memory cell comprises the steps of:

forming a trench in a substrate;
doping the walls of said trench;
forming a first insulator overall;
forming a first conductive layer overall;
forming an opening in said first conductive layer and said first insulating layer, thus exposing the surface of said substrate, said opening being adjacent to said trench;
forming a second insulating layer on said substrate in said opening;
forming and patterning a second conductive layer to provide a gate covering a portion of said second insulating layer in said second opening; and
introducing dopant atoms into the portion of said substrate under said opening and not covered by said gate.

DETAILED DESCRIPTION

Figure 1:
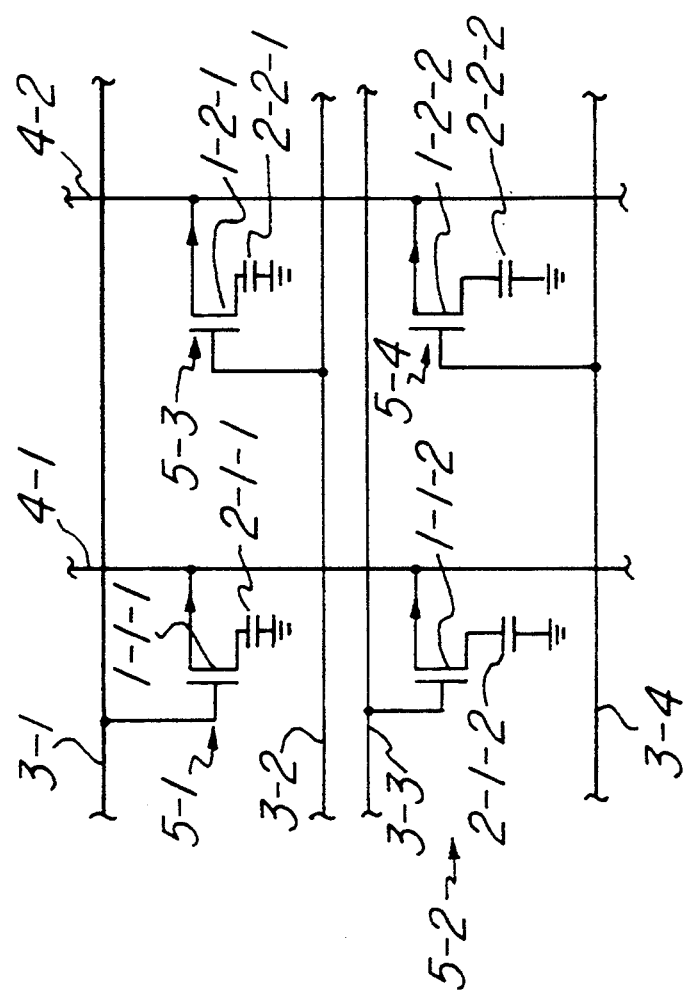
FIG. 1 is a schematic diagram of a dynamic random access cell memory array illustrating the operation of one embodiment of the present invention.
Figure 2:
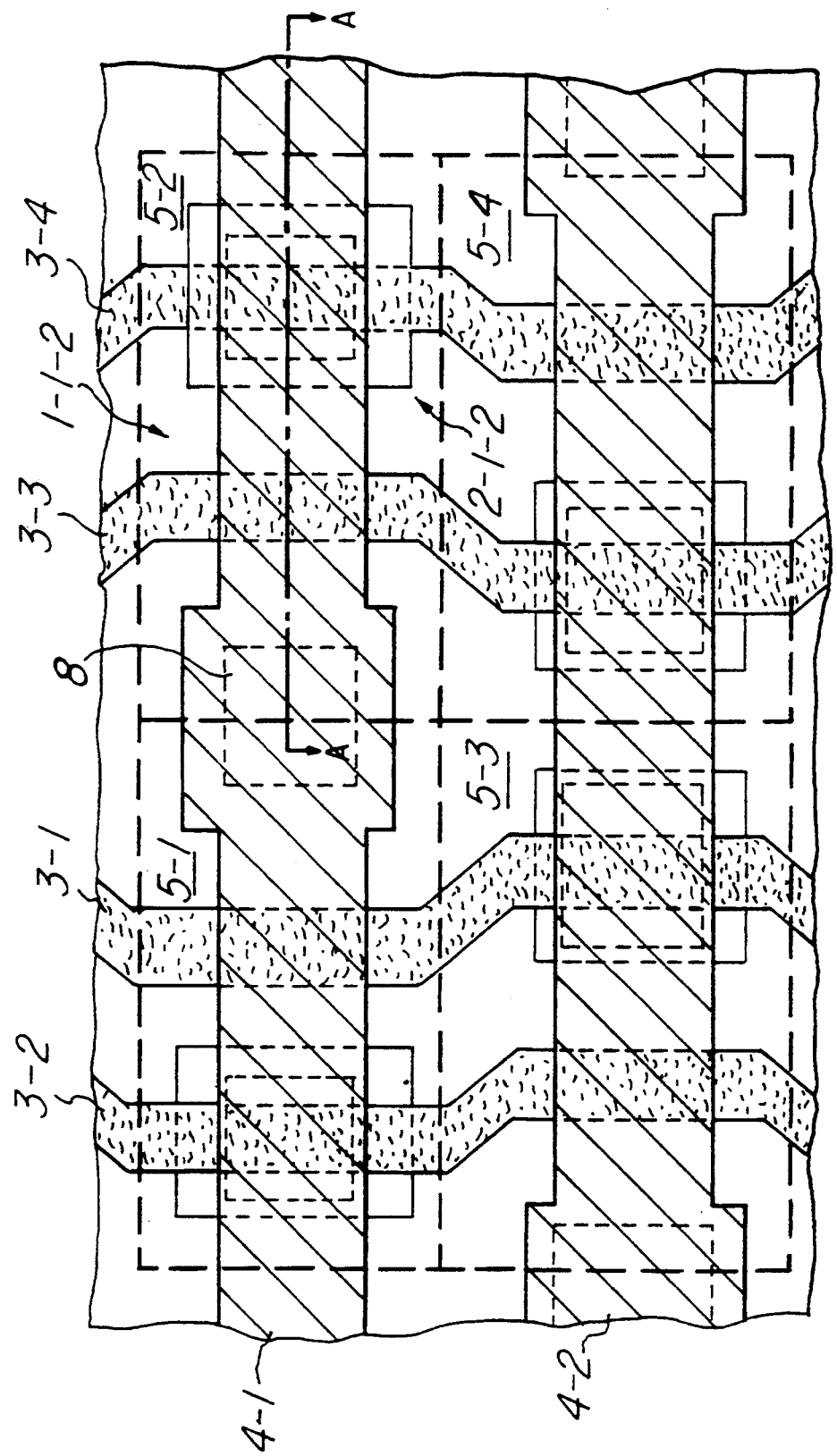
FIG. 2 is a plan view of one embodiment of the present invention.
Figure 3:
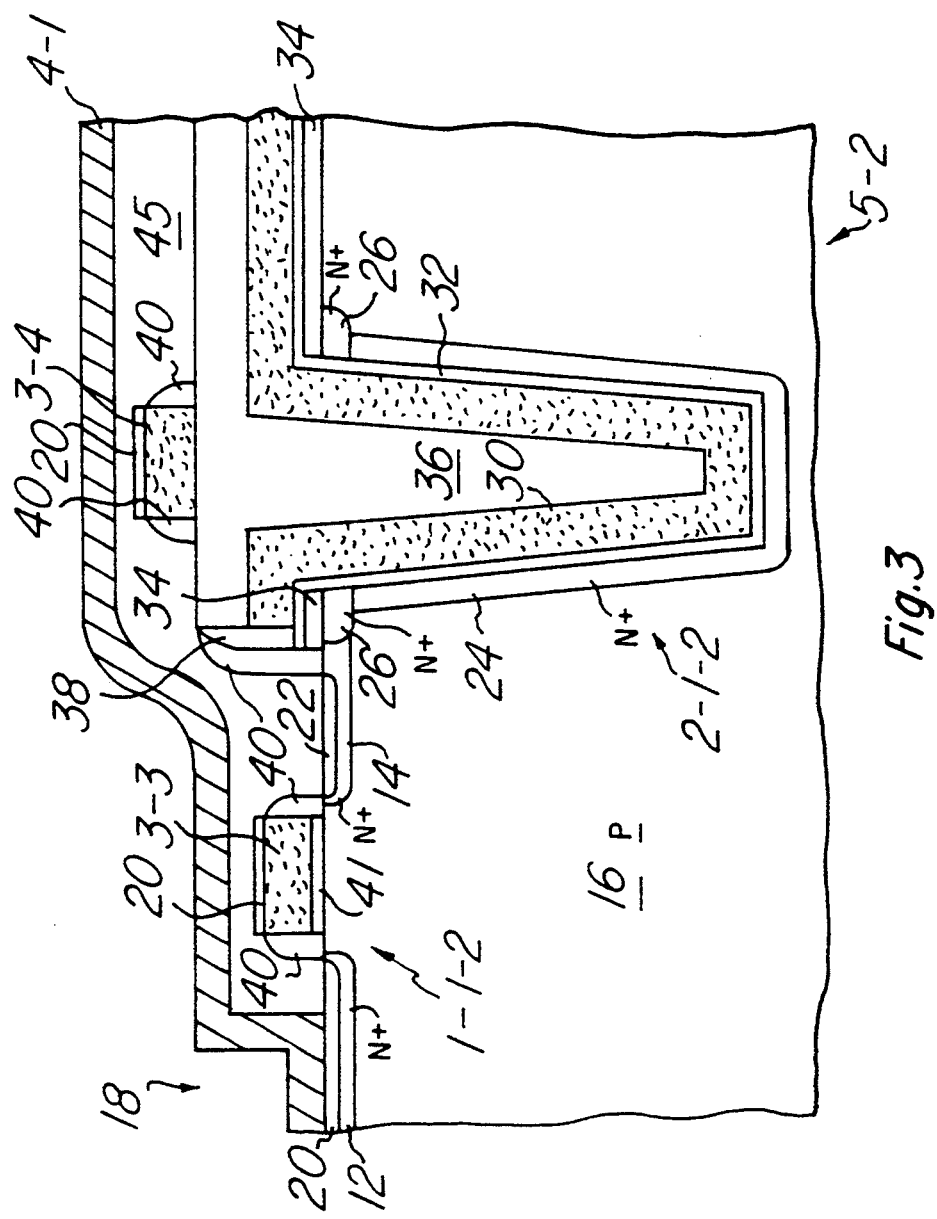
FIG. 3 is a sectional view along section AA of FIG. 2.

FIG. 1 is an electrical schematic diagram showing the electrical characteristics of one embodiment of the present invention. FIG. 2 is a plan view diagram showing the layout of four cells comprising one embodiment of the present invention. FIG. 3 is a sectional view of one memory cell of the embodiment shown in FIG. 2 along sectional line AA.

FIGS. 4A through 4H are sectional view diagrams of the section shown in FIG. 3 at various steps during the processing to fabricate the memory cells shown in FIG. 3.

The schematic diagram of FIG. 1 shows a layout of four memory cells 5-1 through 5-14 arranged in an array. The array of FIG. 1 is specifically adapted to function in a folded bit line scheme. In a folded bit line scheme, the word lines such as word lines 3-1 through 3-4 are connected to the gates of the pass transistors of the memory cells in every other column. This allows for the connection of the sense amplifier having one input end of the comparator circuit of the sense amplifier, connected to a bit line such as bit line 4-1 and the other comparator input of the sense amplifier, connected to the adjacent bit line such as bit line 4-2. In operation, when a high voltage signal is placed on a word line such as word line 3—3, pass transistor 1-1-2 is turned on thus connecting capacitor 2-1-2 to bit line 4-1. On the other hand, the signal placed on word line 3—3 does not cause any pass transistor to connect a storage capacitor to bit line 4-2. Thus bit line 4-2 may be used as a balanced load to the sense amplifier to precisely balance the characteristics of bit line 4-1. This is usually done in conjunction with precharging circuitry and a dummy memory cell to provide very precise load control between the two bit lines. If the high voltage signal is on the word line 3—3 while a writing signal is placed on bit line 4-1, that writing signal is stored on capacitor 2-1-2 and thereafter the signal provided on word line 3—3 is brought to a logical zero to complete storage of the writing signal provided on bit line 4-1 onto capacitor 2-1-2.

FIG. 2 is a plan view diagram of the embodiment shown in FIG. 1 with dash lines indicating where memory cells 5-1 through 5-4 are located in the plan view of FIG. 2. Transistor 1-1-2 and capacitor 2-1-2 of memory cell 5-2 are indicated in FIG. 2. Contact to the drain of transistor 1-1-2 from bit line 4-1 is made at contact 8. The gate of transistor 1-1-2 is a portion of word line 3—3. Components having numbers corresponding to the numbers in FIG. 1 perform the functions indicated in the schematic diagram of FIG. 1.

FIG. 3 is a side view schematic diagram of memory cell 5-2 as taken along the section AA of FIG. 2. Gate 13, which is a part of word line 3—3 controls current between drain region 12 and source region 14. Drain region 12 and source region 14 are of opposite conductivity type to substrate 16. In the described embodiment, substrate 16 is P type and drain 12 and source 14 are N+ type. Also in the described embodiment substrate 16 is a crystalline silicon semiconductor substrate. Bit line 4-1 makes a connection to drain 12 through contact 18. Conductivity and contact integrity are aided by titanium silicide layer 20 formed on the surface of drain region 12. Conductivity is also aided by titanium silicide layer 22 formed on the surface of source region 14.

Charge is stored on storage region 24, which is doped to N+ type. Connection between source region 14 and storage region 24 is made by N+ region 26. In addition, thick silicon dioxide region 34 provides reduced capacitive coupling at the corner between N+ region 26 and field slate region 30 to reduce the high field leakage effects at the corner between these two regions. Field plate 30 and storage region 24 together with a dielectric layer 32 form the storage capacitor 2-1-2 of the memory cell 5-2. Thick silicon dioxide region 34 is formed during the oxidation step used to form a portion of dielectric layer 32. Field plate 30 and storage region 24 are separated by dielectric layer 32. Field plate 30 also provides isolation between adjacent memory cells via electric field isolation effects across dielectric 34 into substrate 16. For example, dielectric 34 can be a silicon dioxide layer. Field plate 30 is connected to a selected potential to provide appropriate isolation levels. Silicon dioxide layer 36 provides isolation between field plate 30 and word line 3—4. Sidewall nitride layer 38 increases integrity of the silicon dioxide layer 36 and provides increased isolation between field plate 30 and source region 14. Sidewall silicon dioxide regions 40 provide increased isolation between word line 3—3 and source region 14 and drain region 12. In addition, sidewall silicon dioxide layers 40 aid in the fabrication of titanium silicide layers 20 and 22 and drain and source regions 12 and 14.

Figure 4A:
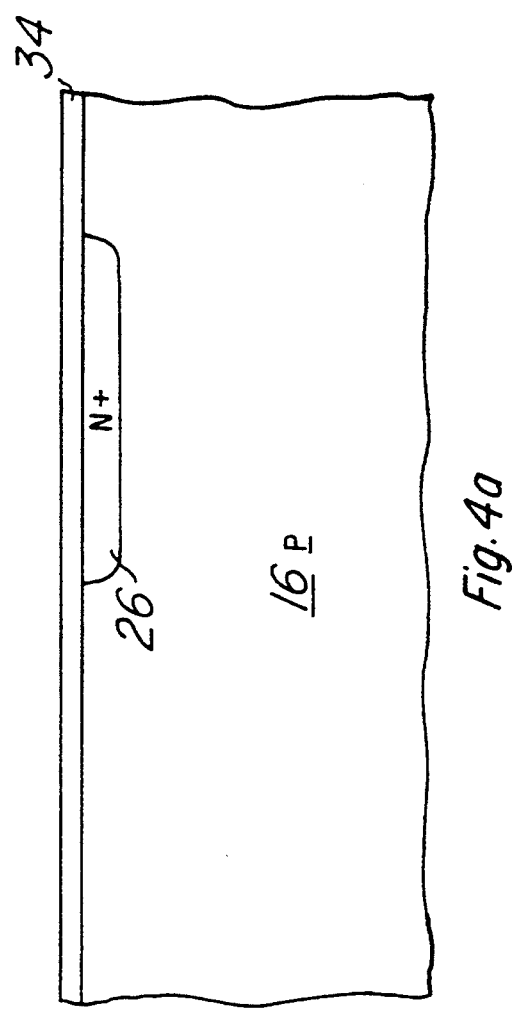
FIGS. 4A through 4H are sectional views showing the processing steps necessary to fabricate the embodiment of FIG. 3.

FIGS. 4A through 4H are section diagrams showing the processing steps used to fabricate memory cell 5-2 of FIG. 3. The process shown in FIGS. 4A through 4H begins with a P type substrate 16 as shown in FIG. 4A. Silicon dioxide layer 34 is formed on the surface of substrate 16 to a thickness of approximately 400 Angstrom using thermal oxidation in an oxygen environment at a temperature of 900° C. for approximately 20 minutes. N+ region 26 is formed by ion implantation through silicon dioxide layer 34 using Arsenic ions at an energy of approximately 100 kiloelectron volts and a density of approximately $2 \times 10^{15}$ ions/cm$^2$. This ion implantation is then driven in using a thermal heating step at a temperature of approximately 900° C. in an inert environment for approximately 100 minutes. This provides the structure shown in FIG. 4A.

Figure 4B:
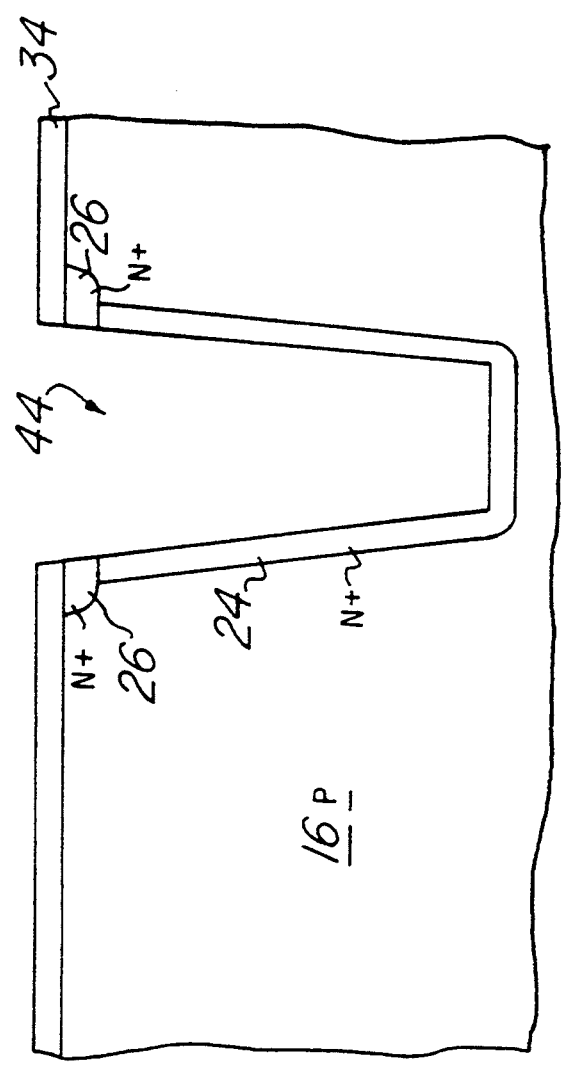

The silicon dioxide layer 34 is then patterned and etched to provide opening 44 as shown in FIG. 4B. In the present embodiment, opening 44 is a rectangular opening approximately $0.95\mu \times 0.95\mu$. Substrate 16 is then subjected to a highly anisotropic etch such as the etch shown in Douglas, U.S. Pat. No. 4,784,720 issued Nov. 15, 1988 and assigned to the assignee of this application. This reference is hereby incorporated by reference.

Figure 4C:
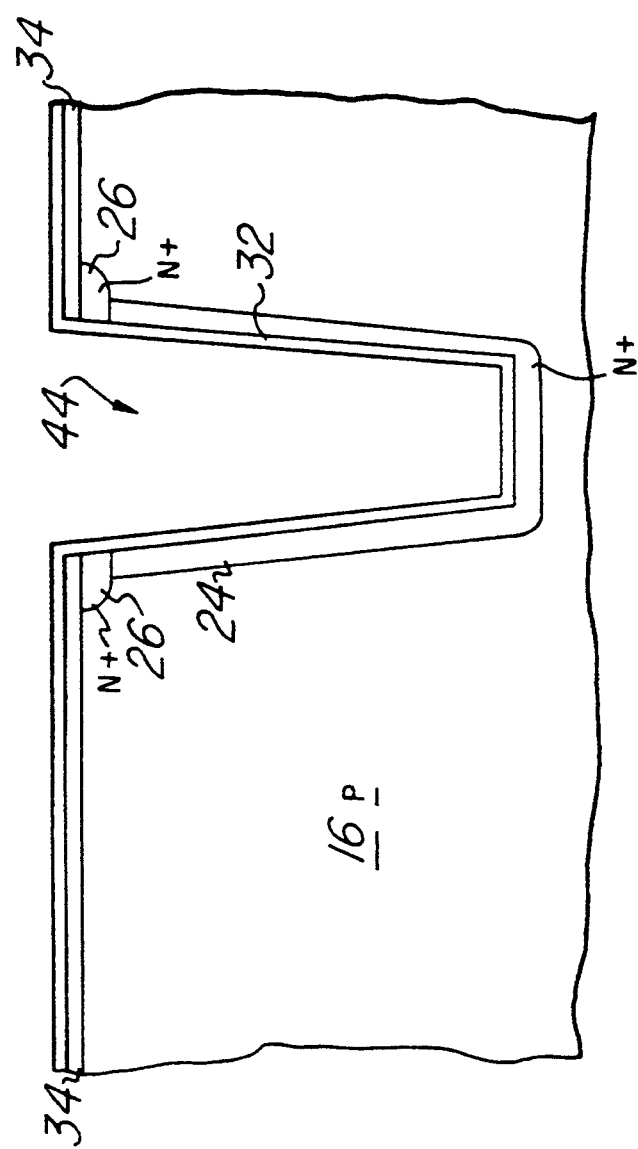

The structure of FIG. 4C is then etched in a highly anisotropic etch until a desired depth of approximately 5 microns is achieved to provide trench 44 as shown in FIG. 4B. In the present embodiment, trench 44 is a right rectangular cylinder tapering toward the bottom. The sidewall regions of trench 44 are then doped using ion implantation with Arsenic ions having an energy of approximately 100 kiloelectron volts and a density of approximately $5 \times 10^{15}$ ions/cm$^2$. This implantation is driven in, and the implantation damage annealed, in a Nitrogen environment at approximately 900° C. for approximately 60 seconds, producing the structure shown in FIG. 4B.

A layer of silicon nitride 32 is then deposited using chemical vapor deposition to a thickness of approximately 180 Angstroms, as shown in FIG. 4C. Silicon nitride layer 32 is then sealed by thermal oxidation in a steam environment at a temperature of approximately 900° C. for approximately 20 minutes. In an alternative embodiment, silicon dioxide layer 32 can include a thinner silicon dioxide layer approximately 60 Angstroms thick by a very thin silicon nitride layer approximately 100 Angstroms thick. This silicon nitride layer is then oxidized to provide a very thin top silicon dioxide layer to provide a high quality dielectric layer. This technique is further described in Haken, U.S. Pat. No. 4,577,390, issued Mar. 25, 1986 and assigned to the assignee of this application. This patent is hereby incorporated by reference.

Figure 4D:
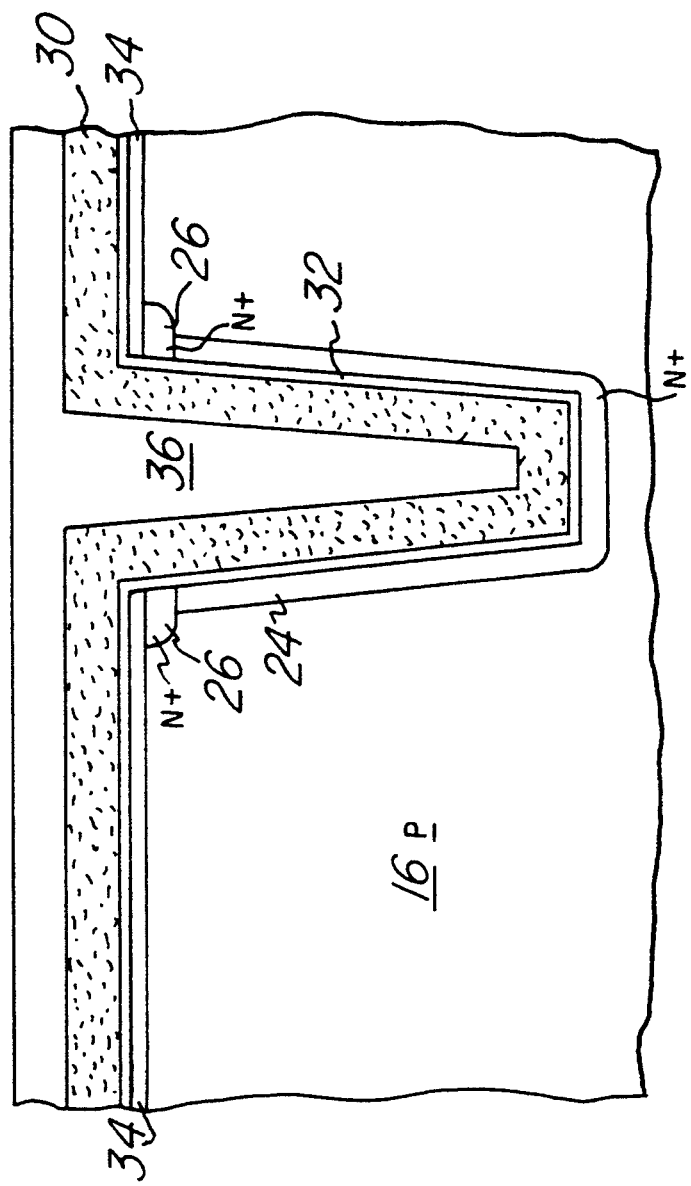

A layer of polycrystalline silicon deposited by chemical vapor deposition is deposited to a thickness of approximately 2,500 Angstroms and doped to a resistance of approximately 25Ω/☐ on the structure of FIG. 4C. Chemical vapor deposition provides a conformal deposition which provides a uniform thickness across the walls of trench 44. A layer of silicon dioxide is then deposited by chemical vapor deposition to a thickness of at least twice the remaining opening of trench 44, in this case approximately 5,500 Angstroms. This silicon dioxide layer is planarized using etch-back planarization. Additional silicon dioxide of approximately 2,500 Angstroms is then deposited on the planarized surface. This completely fills trench 44 and provides a relatively flat uniform surface on the top layer of silicon dioxide layer 36 as shown in FIG. 4D.

Figure 4E:
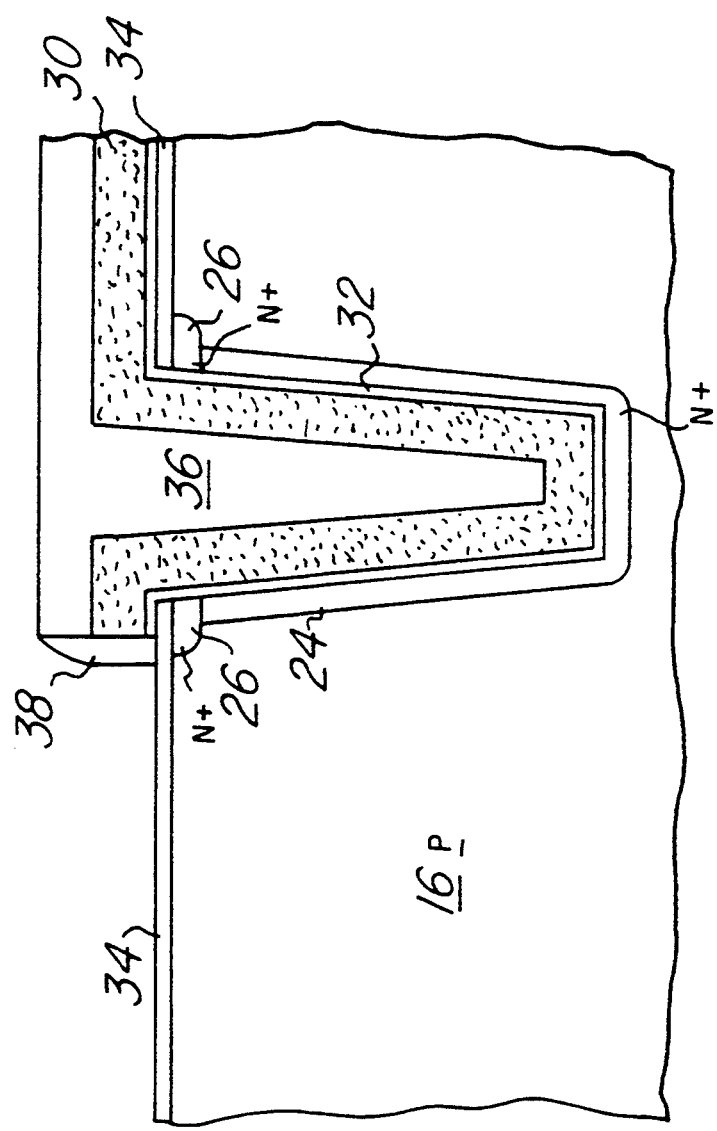
Figure 4F:
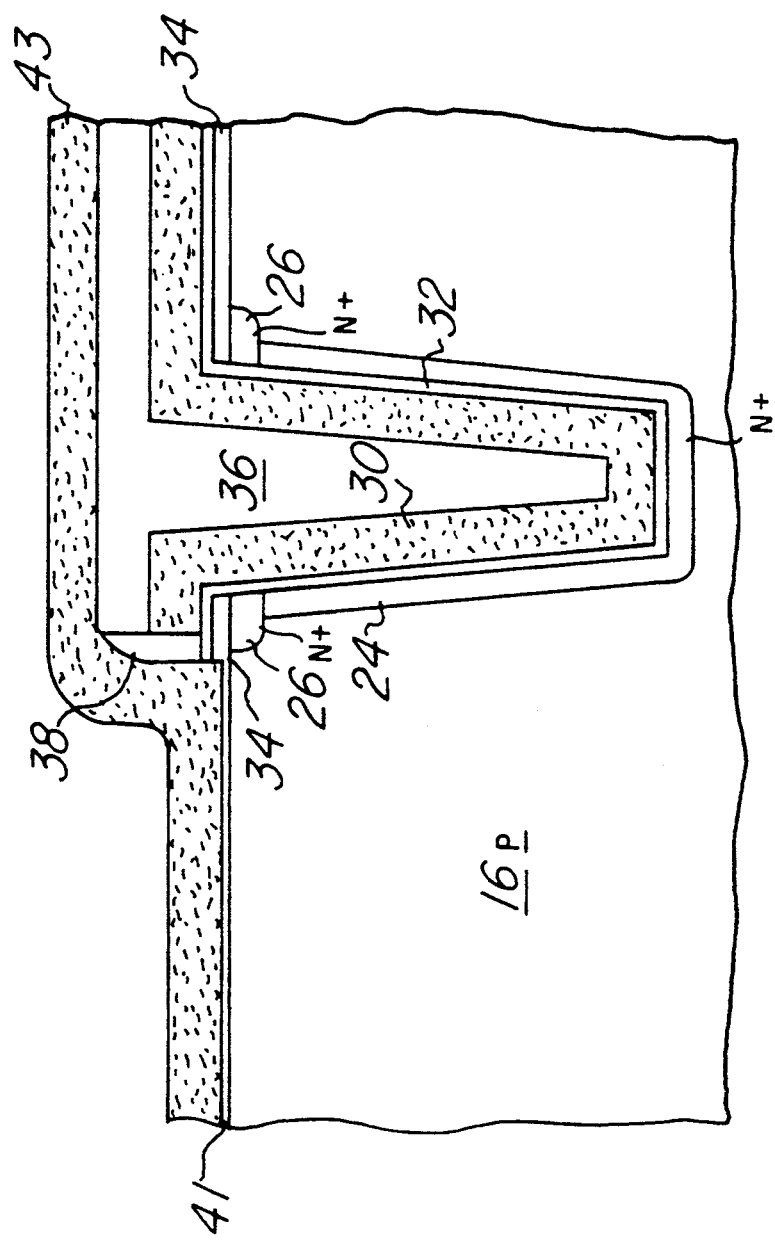
Figure 4G:
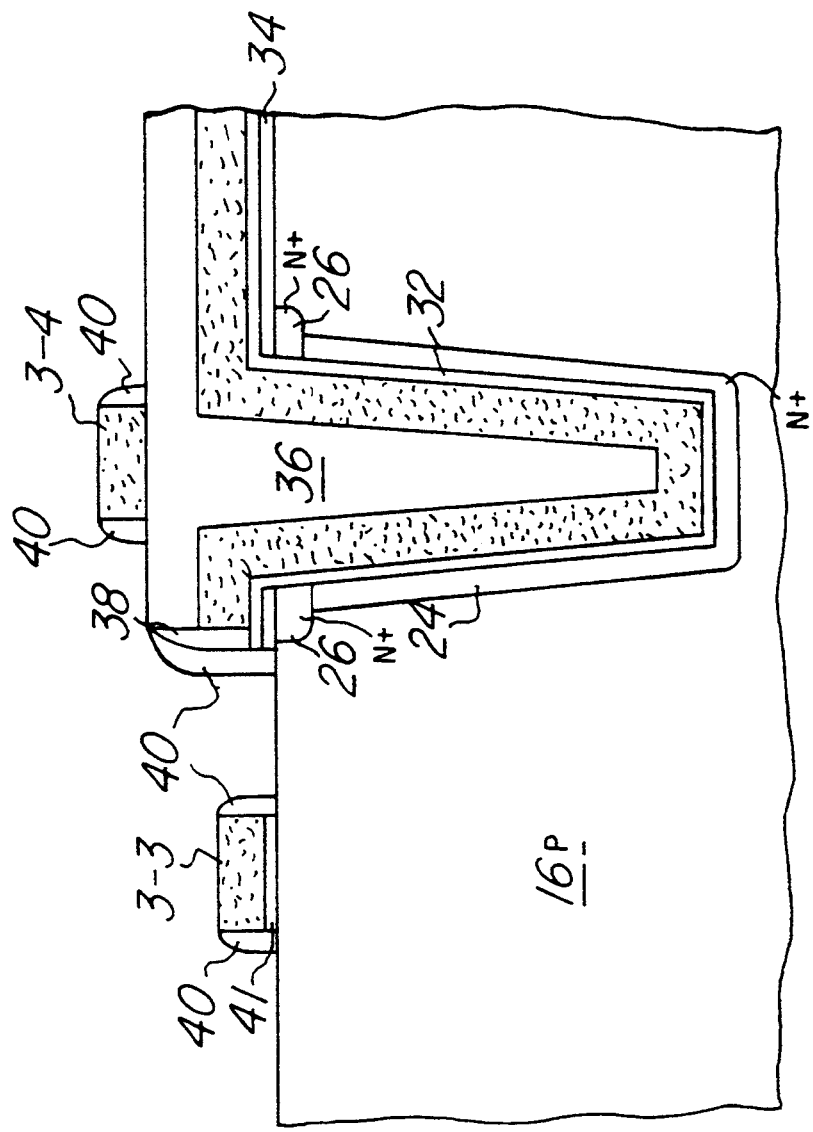

Silicon dioxide layer 36 and polycrystalline silicon layer 30 are then patterned using standard photolithographic and etching techniques. A layer of silicon nitride (not shown) is then deposited overall using chemical vapor deposition. This silicon nitride layer is then etched using anisotropic etching which leaves a sidewall nitride layer 38 as shown in FIG. 4E. An anisotropic etch is used to remove the exposed portion of silicon dioxide layer 34 to expose substrate 16. This will of course remove a portion of silicon dioxide layer 36, but because silicon dioxide 36 is much thicker than silicon dioxide layer 34, this loss in thickness is of no real consequence. A thermal oxidation step is performed in an oxygen ambient at a temperature of approximately 900° C. for approximately 10 minutes to form silicon dioxide layer 41 as shown in FIG. 4F. A layer of polycrystalline silicon 43 is then deposited to a thickness of approximately 3500 Angstroms using chemical vapor deposition and is doped to a resistance 70Ω/☐ approximately Polycrystalline silicon layer 43 is then patterned and etched using standard photolithographic techniques to provide word lines 3—3 and 3-4 as shown in FIG. 4G. Lightly doped regions (not shown) may be formed at this stage using an ion implantation of Arsenic ions having an energy of 150 kiloelectron volts and a density of approximately $1 \times 10^{15}$ ions per centimeter$^2$. A layer of silicon dioxide (not shown) is then deposited overall to a thickness of approximately 2100 Angstroms and is then etched anisotropically to provide silicon dioxide sidewall layers 40 as shown in FIG. 4G.

Figure 4H:
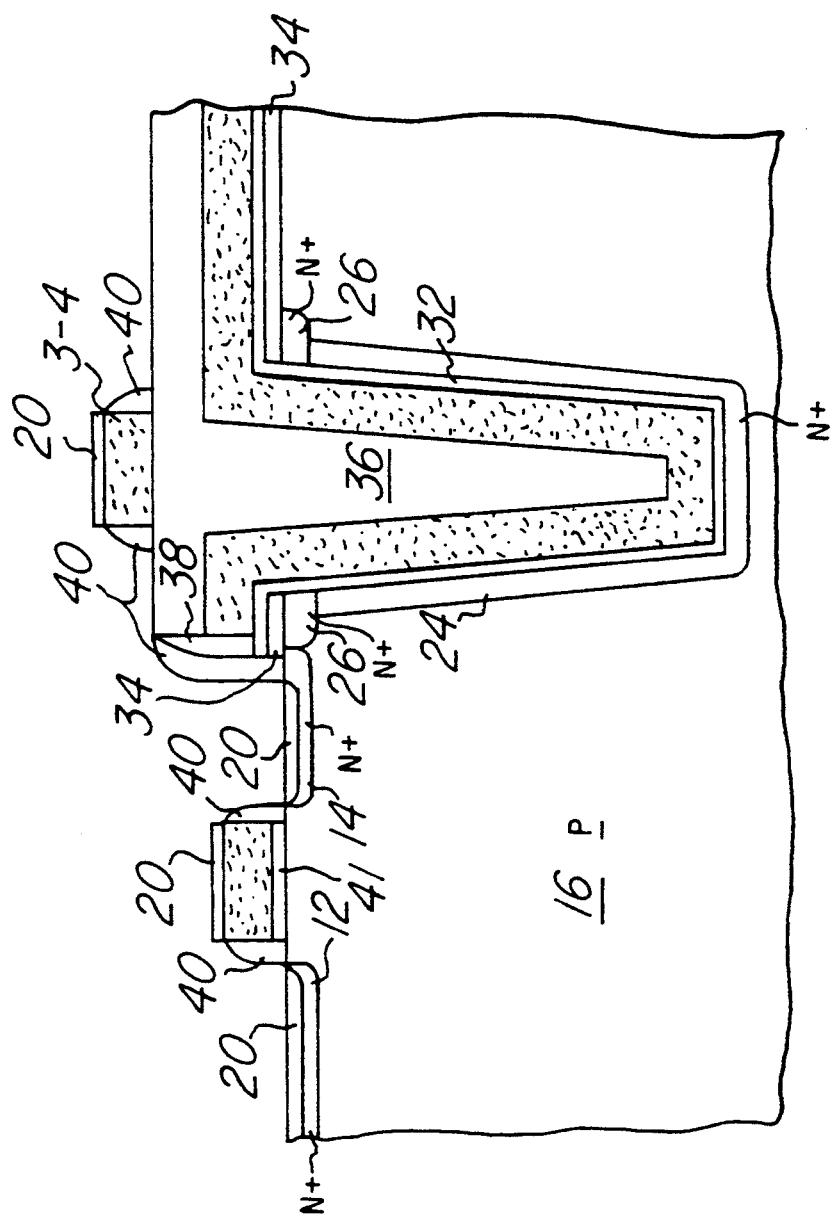

The structure of FIG. 4G is then subjected to an ion implantation step of Arsenic ions at an energy of approximately 150 kiloelectron volts at a density of approximately $3 \times 10^{15}$ Atoms per centimeter$^2$. This is then driven in to provide drain region 12 and source region 14 as shown in FIG. 4H. A layer of titanium (not shown) having a thickness of approximately 1,500 Angstroms is then sputtered on the surface as a structure of FIG. 4H and annealed to create titanium silicide regions 20 as shown in FIG. 4H. The unreacted titanium and other by-products of the titanium direct reaction process are removed by chemical etching. This process is more fully described in Lau, U.S. No. 4,545,116, issued Oct. 8, 1985 and Tasch, U.S. Pat. No. 4,384,301, issued May 17, 1983; both assigned to the assignee of this application and both are hereby incorporated by reference. A layer of silicon dioxide is then formed on the surface of the structure of FIG. 4H by chemical vapor deposition to a thickness of approximately 7,800 Angstroms and patterned to provide interlevel silicon dioxide layer 45 as shown in FIG. 3. A layer of titanium/tungsten is then sputtered onto the surface of silicon dioxide layer 45 and into contact 18 to a thickness of approximately 5,100 Angstroms. This titanium/tungsten layer is patterned to provide bit line 4-1, which contacts drain 12 via titanium silicide layer 20.

Although specific embodiments of the present invention are described herein, they are not to be construed as limiting the scope of the invention. The present embodiments are presented for exemplary purposes only and many further embodiments will become apparent to those skilled in the art in the light of this specification. The present invention is limited only by the claims appended hereto.

Technical Advantages

The described embodiments of the present invention provide a highly dense memory cell by eliminating unnecessary elements such as field oxidation regions between memory cells by providing an integrated field plate structure for isolation and capacitance enhancement purposes. Heavily doped N+ region 26 provides automatic registration between the source region of transistor 1-1-2 and storage region 24. The low conductivity of small diffused And polycrystalline silicon regions is overcome by silicidation of those regions.

What is claimed is:

1. A method for forming a device, comprising the steps of:
   forming a first insulator on a surface of a substrate;
   then forming a trench through the first insulator and into the substrate;
   doping walls of said trench to form an information storage region;
   forming a first insulating layer on the walls of said trench and above the first insulator on the surface of said substrate in an area of said substrate adjacent said trench;
   forming a first conductive layer on said first insulating layer;
   then depositing a second insulator into a remaining trench opening and flattening a top surface of the second insulator;
   next forming an opening in said second insulator, said first conductive layer and said first insulating layer, said opening being adjacent to said trench;
   forming a sidewall insulator on exposed sides of the opening through said second insulator, said first conductive layer, and said first insulating layer;
   removing from said opening an exposed portion of said first insulator;
   thereafter forming a second insulating layer on said substrate as a gate insulator in said opening;
   next forming and patterning a second conductive layer to provide a gate electrode covering a portion of said second insulating layer in said opening;
   subsequently introducing dopant atoms into the portion of said substrate under said opening and not covered by said gate to form a drain region; and
   leaving a portion of the first insulator on said surface of said substrate and interposed between said information storage region and said first conductive layer.

2. A method as in claim 1 wherein said first insulating layer comprises silicon dioxide.

3. A method as in claim 1 further comprising the step of: electrically connecting a bit line to said drain region.

4. A method for forming a device, comprising the following sequence of steps:
   forming a silicon dioxide layer on a surface of a substrate;

forming a trench through the silicon dioxide layer and into said substrate that includes a transistor channel;
doping walls of said trench;
forming a first insulator overall;
forming a first conductive layer overall;
depositing a second insulator with a flat surface overall;
forming an opening in said second insulator, said first conductive layer and said first insulator, said opening being adjacent to said trench and exposing said transistor channel;
depositing a sidewall insulator on exposed sidewalls of said second insulator, said first conductive layer, and said first insulator;
removing from said opening an exposed portion of said silicon dioxide layer;
forming a first insulating layer on said substrate over said transistor channel in said opening;
forming and patterning a second conductive layer to provide a gate covering a portion of said second insulating layer in said opening; and
introducing dopant atoms into the portion of said substrate under said opening and not covered by said gate.

5. A method for forming a device, in accordance with claim 4, wherein
the step of forming the first insulating layer includes forming a transistor gate insulator.

6. A method for forming a device, in accordance with claim 5, wherein
the step of forming and patterning the second conductive layer includes forming a word line and transistor gate electrode over said transistor gate insulator.

7. A method for forming a device, in accordance with claim 6, wherein
the step of introducing dopant atoms into the portion of the substrate includes creating transistor source and drain electrodes adjacent said transistor channel.

8. A method for forming a device, in accordance with claim 7, wherein
the step of doping the walls of said trench, forming a first insulator overall, and forming a first conductive layer overall produce a capacitor, connected to either said transistor source electrode or said transistor drain electrode.

9. A method for forming a device, in accordance with claim 4, wherein
the step of introducing dopant atoms into the portion of said substrate includes creating transistor source and drain electrodes adjacent said transistor channel.

10. A method for forming a device, in accordance with claim 4, wherein
the steps of doping the walls of said trench, forming a first insulator overall, and forming a first conductive layer overall produce a capacitor; and
the step of introducing dopant atoms into the portion of said substrate includes creating a transistor source or drain electrode adjacent said transistor channel with one of those electrodes connected to the doped walls of said trench.

* * * * *